(12) United States Patent
Nishinaga

(10) Patent No.: US 6,368,733 B1
(45) Date of Patent: Apr. 9, 2002

(54) ELO SEMICONDUCTOR SUBSTRATE

(75) Inventor: Tatau Nishinaga, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/369,148

(22) Filed: Aug. 5, 1999

Related U.S. Application Data

(60) Provisional application No. 60/116,584, filed on Jan. 20, 1999.

(30) Foreign Application Priority Data

Aug. 6, 1998 (JP) .......................................... 10-223281
Sep. 11, 1998 (JP) .......................................... 10-258868

(51) Int. Cl.$^7$ ................................................ B32B 9/00
(52) U.S. Cl. ........................ 428/698; 428/699; 428/700
(58) Field of Search ........................ 117/84; 257/86–95; 428/614, 622, 642, 688, 698, 699, 700

(56) References Cited

U.S. PATENT DOCUMENTS

| | | | | |
|---|---|---|---|---|
| 4,816,420 A | * | 3/1989 | Bozler et al. ................... | 437/2 |
| 4,952,526 A | * | 8/1990 | Pribat et al. ................... | 437/89 |
| 5,828,088 A | * | 10/1998 | Mauk ........................... | 257/98 |
| 5,846,320 A | * | 12/1998 | Matsuyama ................... | 117/90 |
| 6,015,979 A | * | 1/2000 | Sugiura et al. ................ | 257/86 |
| 6,121,121 A | * | 9/2000 | Koide ........................... | 438/481 |
| 6,172,382 B1 | * | 1/2001 | Nagahama et al. ............ | 257/94 |

FOREIGN PATENT DOCUMENTS

JP  3-133182 A  6/1991 ........... H01L/33/00

OTHER PUBLICATIONS

The Electrochemical Society Extended Abstracts, vol. 89–2, Hollywood, Florida, Oct. 15–20, 1989, pp. 536–537.

\* cited by examiner

*Primary Examiner*—Robert Kunemund
*Assistant Examiner*—Matthew Anderson
(74) *Attorney, Agent, or Firm*—Sughrue Mion, PLLC

(57) ABSTRACT

A semiconductor substrate comprising a single crystal substrate having thereon a mask and a Group III-V compound semiconductor epitaxially grown layer, said mask comprising an insulating material thin film or high melting point metal thin film having a plurality of slit-like exposed areas running at an angle in excess of 0°, and said Group III-V compound semiconductor epitaxially grown layer being formed by growing a Group III-V compound semiconductor starting from each of said plurality of exposed areas and conjunction-integrating the grown semiconductors on said mask.

11 Claims, 7 Drawing Sheets

US 6,368,733 B1

ELO SEMICONDUCTOR SUBSTRATE

CROSS REFERENCE TO RELATED APPLICATIONS

This application is an application filed under 35 U.S.C. §111(a) claiming benefit pursuant to 35 U.S.C. §119(e)(i) of the filing date of the Provisional Application No. 60/116,584 filed Jan. 20, 1999 based on Japanese Applications 10-258868 filed Sep. 11, 1998 and 10-223281 filed Aug. 6, 1998 pursuant to 35 U.S.C. §111(b).

FIELD OF THE INVENTION

The present invention relates to a low dislocation substrate useful for epitaxial growth mainly of a GaN system.

BACKGROUND OF THE INVENTION

GaN has been already put into commercial products as a crystal for short wavelength light elements such as blue and ultraviolet light. Further, studies are being made thereon for developing higher performance elements or on application to electronic devices. However, a GaN-type crystal has no single crystal substrate for its epitaxial growth. Therefore, at the present time, a method of growing a low temperature buffer layer on a sapphire substrate and growing thereon a GaN single crystal layer at a high temperature is mainly used.

The GaN crystal layer grown by this method allows the presence of a very large number of crystal defects due to the great difference in the lattice constant between the substrate sapphire and GaN. The defect density in general is said to be from $10^8$ to $10^{10}/cm^2$.

When an electronic device is manufactured using such a crystal having many defects, the electronic device is readily deteriorated. This is a serious problem of a laser diode (LD) using a large current.

Accordingly, various attempts are being made to reduce the defects of GaN crystal. One method for reducing crystal defects is transverse growth.

For example, JP-B-6-105797 (the term "JP-B" as used herein means an "examined Japanese patent publication") discloses a technique of forming a mask comprising an insulating material thin film or high melting point metal thin film on a semiconductor substrate such that an exposed area in the shape of a fine line is provided on a part of the mask, and growing a low dislocation epitaxial layer in the direction parallel to the substrate surface by epitaxy over the entire surface of the substrate through the exposed area.

The principle of obtaining low dislocation by this transverse growth is briefly described below. An insulating material thin film or high melting point metal thin film having partially provided thereon exposed areas is formed as a mask on the surface of a semiconductor substrate and an epitaxial layer is grown on this substrate. At this time, by selecting the conditions, the crystal grown using the exposed area as a seed grows in the transverse direction on the surface of the thin film mask part.

The grown layer on the thin film mask does not take over the dislocation directly from the substrate, as a result, an epitaxial growth layer free of or reduced in the dislocation can be obtained.

However, the transverse direction has a problem in that crystal defects are readily generated at the portion where two layers grow in the transverse direction on the mask part surface joining from two adjacent exposed areas.

For example, a case where a GaN layer is grown in the GaN single crystal film on a sapphire substrate using the transverse direction by MOCVD method is reported (see, *Applied Physics Letters*, vol. 72, No. 2, page 211 (1998)).

In this paper, FIG. 1 at page 211 shows the surface state after an epitaxial growth layer is etched to the depth of 4 µm. In this figure, a large number of linear etch pits are present in the epitaxial growth layer near the center of the $SiO_2$ film mask part. This reveals incomplete joining. On the other hand, the paper emphasizes that by etching of 1 µm, almost no etch pit is generated in the region on the $SiO_2$ film mask part and complete joining is attained.

In either case, it is understood that defects are readily produced in the junction area.

SUMMARY OF THE INVENTION

An object of the present invention is to provide a technique of transverse growth, where the insulating material thin film or high melting point metal thin film formed on a single crystal surface is designed to have a specific shape to thereby reduce the crystal defects appearing in the junction area of epitaxial growth layers grown from adjacent exposed areas on the mask part and provide a crystal layer reduced in the defects as compared with that formed by conventional techniques.

DETAILED DESCRIPTION OF THE INVENTION

Figure 1:
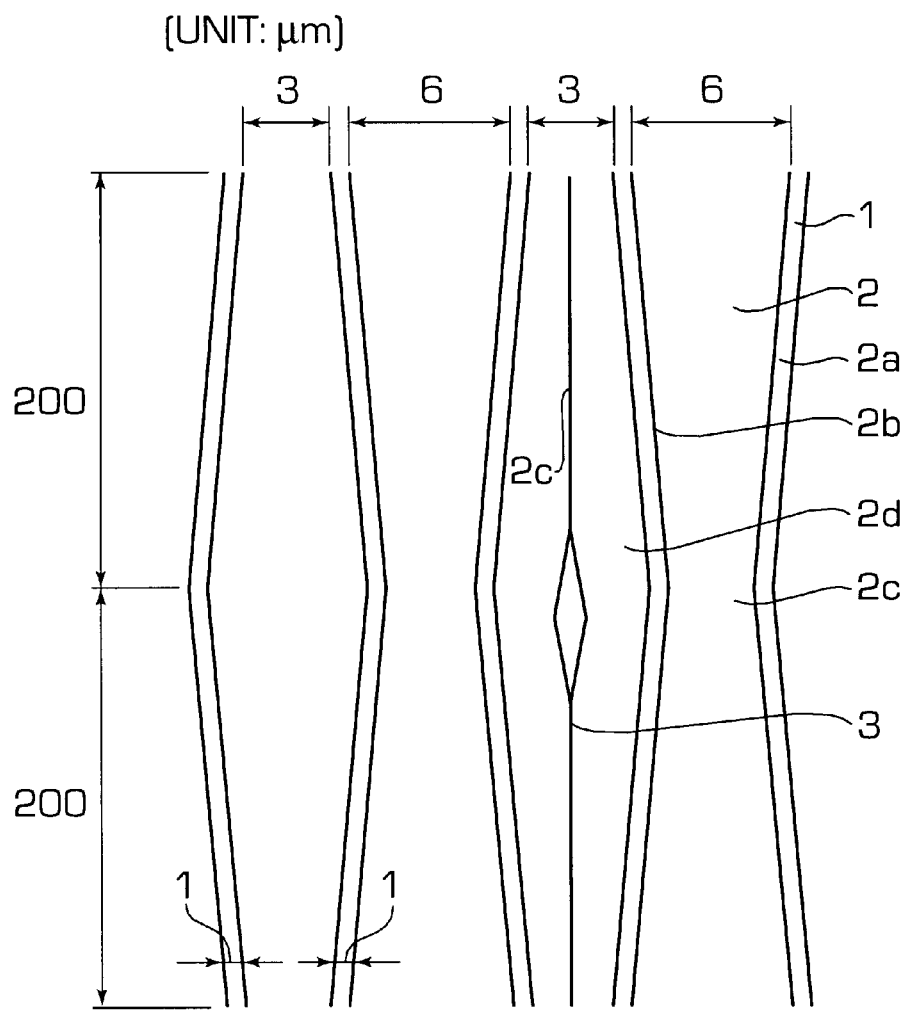
FIG. 1 is a view showing one example of the mask for use in the present invention and also showing the transverse growth process.

The present inventors have studied in detail the cause of generation of the linear crystal defects in the junction area on a mask in the transverse growth and reached the present invention.

In the transverse growth, the mask parts adjacent to exposed areas are usually formed like parallel lines and the front parts of the growth layers (hereinafter referred to as a "growth front") grown from adjacent exposed areas grow in parallel. As a result, the two growth fronts come into contact nearly at the center portion of the mask part throughout the length of the growth front.

However, the contact does not take place at the same time throughout the length of the growth front but occurs at many points of the growth front due to slight difference in the growth rate. The region between two adjacent contact points of the contact area is a narrow region closed by two contact points, differently from the region which has heretofore made growth on the mask using a two dimensional free face. In the progress of filling this narrow closed region, slippage of the lattice takes place and induces crystal defects.

The present inventors have found that by allowing the presence of one contact point or a smaller number of contact points in the above-described growth front on the mask, the crystal defects generated can be greatly reduced.

The method for producing the semiconductor substrate of the present invention is described below.

With respect to the material for the single crystal substrate, sapphire ($\alpha$-$Al_2O_3$) and SiC which are easily available can be used in addition to the semiconductor single crystal such as silicon and compound semiconductor. The material is selected from semiconductors, oxides and carbides, approximated as much as possible to the lattice constant of the objective functional layer. For example, when the functional layer is GaN, the (0001) face of sapphire can be used.

Also, a material resulting from growing a basal layer comprising a Group III-V compound semiconductor on the entire surface of the above-described semiconductor, oxide or carbide substrate material can be used as a new substrate material. This basal layer is not conformed to the substrate with respect to the lattice, but can be grown through a polycrystalline or amorphous layer as disclosed in JP-B-62-29397. Of course, the basal layer contains a large number of lattice defects.

On the entire surface of the substrate or the basal layer provided on a substrate, a mask comprising an insulating thin film such as $SiO_2$, $Si_3N_2$ and $Al_2O_3$, or a high melting point metal thin film such as Mo, Pd, Ta and Ni, is formed using a thin film formation means such as sputtering, vacuum evaporation or ion plating. The thickness of the thin film is sufficient if it is from 0.003 to 0.4 $\mu$m.

Then, linear exposed areas (slits) each having a width of from 0.1 to 2 $\mu$m are formed in the thin film using a means such as lithography. The slits are formed each in the length of from 10 to 4,000 $\mu$m to distribute over the entire surface of the mask.

At this time, adjacent exposed areas are not formed to run in parallel but to run at an angle. In other words, the mask part is constructed not to have the same width throughout the length but to have a large width portion and a small width portion. The formation of a mask is described below by reference to the drawings.

FIG. 1 shows one example of the mask pattern for use in the present invention.

In the figure, the small width portions are exposed areas 1 formed after the thin film is removed by etching and the large width portions are mask parts 2. In the example of FIG. 1, the exposed area and the mask part both are bent every 200 $\mu$m and continued in the longitudinal direction. Such a mask pattern is repeatedly formed over the entire surface of the substrate having a size of 20 mm×20 mm. In the figure, the numerical value between arrows is a dimension in the unit of $\mu$m.

In the example of the figure, the angle defined by the two edges 2a and 2b of the mask is about 0.86°, namely, the adjacent exposed areas 1 are formed to lean at an angle of about 0.86°.

Figure 2:
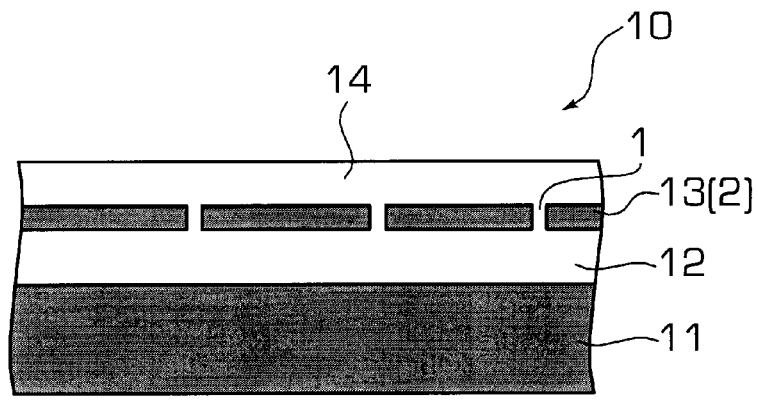
FIG. 2 is a view showing the cross-sectional structure of the semiconductor substrate of the present invention.

When a semiconductor crystal is epitaxially grown on a substrate having such a mask, the crystal grows in the transverse direction starting from the exposed areas 1 toward the region on the mask part 2. The growth fronts first come into contact in the region 2c where the mask width is small and thereafter continue to grow toward the wide region 2d on the mask part 2. At last, an epitaxial growth layer integrated on the mask par 2 is obtained. FIG. 2 shows a cross-sectional structure of the substrate according to the present invention. In the figure, a semiconductor substrate 10 consists of a single crystal substrate 11, a basal layer 12, a mask part 13 and an epitaxial growth layer 14.

By forming the mask part 2 such that two edges 2a and 2b meet at an angle (hereinafter referred to as a "mask boundary angle") in excess of 0°, preferably of 0.30 or more, the layers grown starting from adjacent exposed areas are allowed to come into contact at a portion of the mask part having the smallest width, thus, the contact can be made to occur at one portion.

After contacting at the one portion, the layers continue to grow and the growth layer expands on the mask while leaving the contact portion to stay at one point, so that the lattice can be prevented from slippage and a good transverse growth layer can be obtained.

Figure 7:
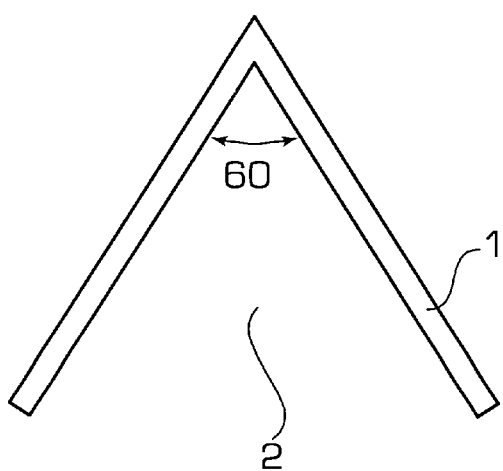
FIG. 7 is a view showing one embodiment of the exposed area.

At this time, if the above-described angle is too small, the one-point contact cannot be attained. It is advantageous for surface emission type devices to form a Vshaped slit bent at an angle of tens of degrees as shown in FIG. 7.

In the case of a laser diode in which the present invention is considered to be mainly used, the size of the active area is a few $\mu$m×hundreds of $\mu$m square for an edge surface emission type and tens of $\mu$m square for a surface emission type. In order to form a low dislocation crystal layer of this size, the contact is not necessarily required to occur at one point throughout the length over the entire surface of the substrate. The requirement can be satisfied by allowing the contact to occur at one point in the length of from tens to hundreds of $\mu$m. Accordingly, most practically, the exposed area is formed to run zigzag in a length of from tens of $\mu$m to 1,000 $\mu$m and to have a width of about 1 $\mu$m.

In the foregoing, a case of forming slit-like exposed areas is described, but the exposed area is not necessarily to be slit-like but it is sufficient if the leading ends of the epitaxial growth are prevented from simultaneously being in a straight line.

Figure 8:
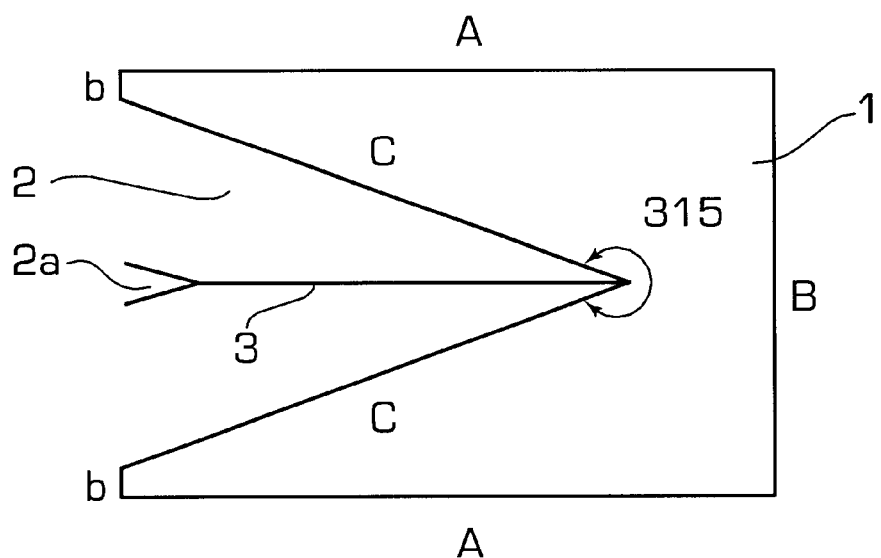
FIG. 8 is a view showing the exposed area of the mask used in Example 7.
Figure 9:
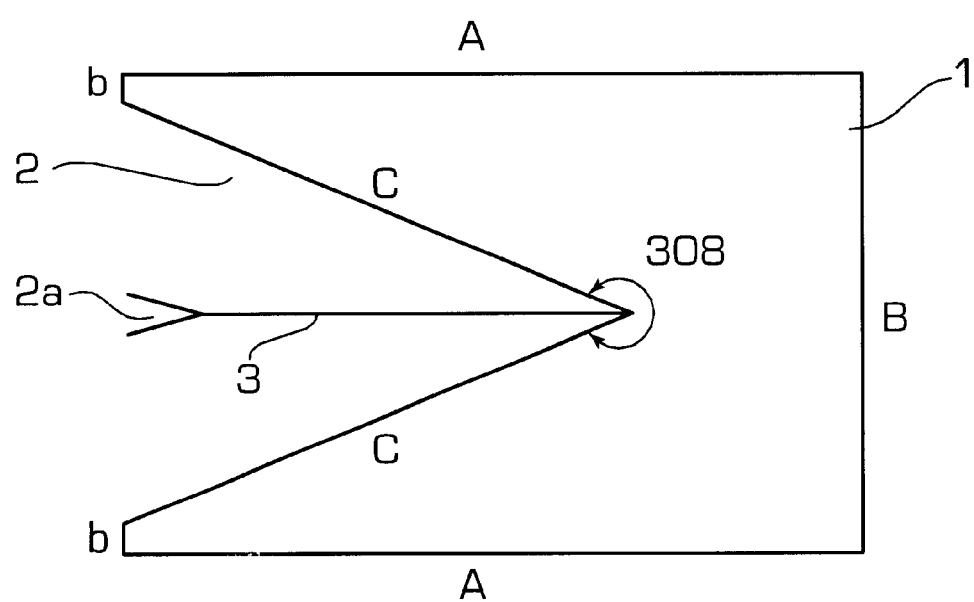
FIG. 9 is a view showing the exposed area of the mask used in Example 8.

In the forgoing, the method is described fundamentally by referring to the formation of a continuous and vertical growth film over the entire surface of the semiconductor substrate. However, in the case of forming a good vertical growth film having a relatively small region, a method of growing the film using a mask having, as shown in FIGS. 8 and 9, a back wedge-shape exposed area (window) provided over the entire surface of the substrate is effective. The principle of achieving a good-quality film is essentially the same as in the case of slit-like windows described above. That is, by allowing growth films growing at an angle to contact at one point in the joining on the mask, a good growth film is formed on the mask part 2 in FIG. 8 or 9. The thus-formed low defect film may have a region smaller than that obtained using slit-like windows However, this is a good-quality crystal film favored with a sufficiently large area in the application to an edge surface reflection type laser or a surface emission laser for which the present invention is considered to be mainly used. In FIGS. 8 and 9, the growth layer extending over the edge lines A and B of the exposed area 1 is a growth layer not satisfying the requirements of the present invention and is substantially unnecessary. By matching the direction of A and B with the low exponential face of the crystal, the growth outside A and B can be advantageously prevented.

Figure 10:
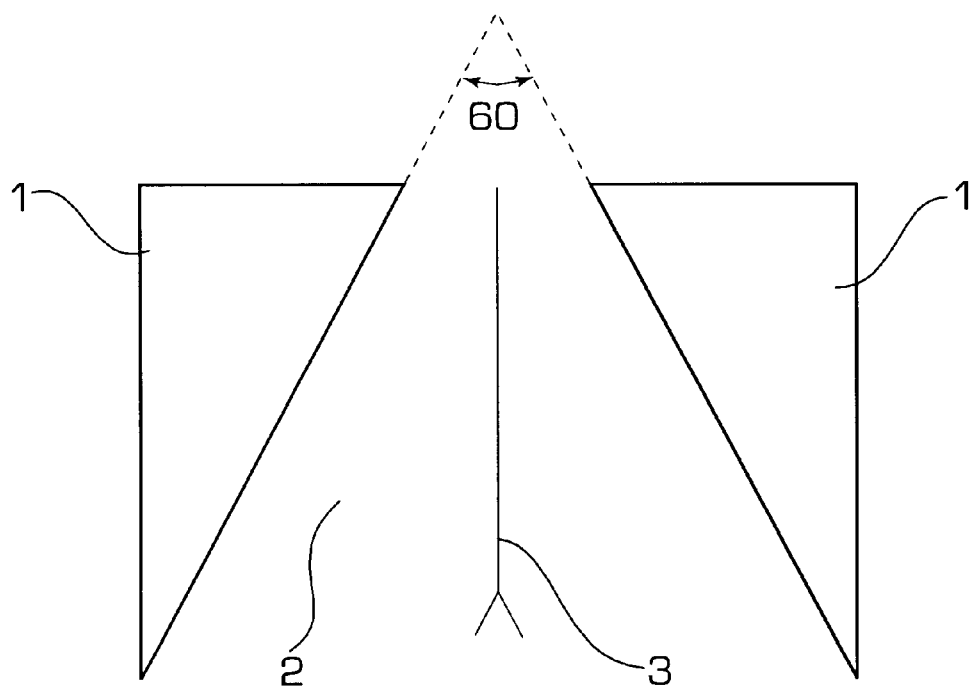
FIG. 10 is a view showing the exposed area of the mask used in Example 9.
Figure 11:
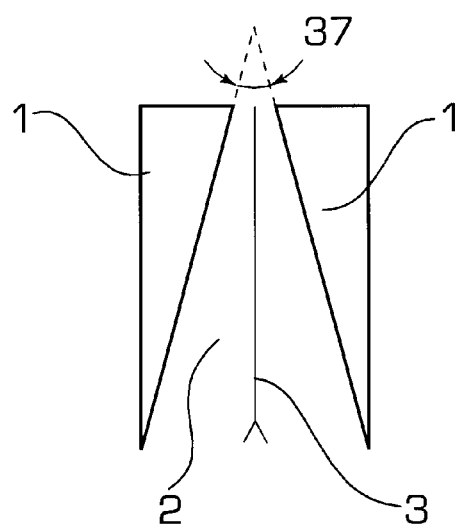
FIG. 11 is a view showing the exposed area of the mask used in Example 10.

It is also effective to divide the back wedge-shape exposed area into two parts as shown in FIGS. 10 and 11 and grow the film on the mask part 2 between two window parts.

The exposed area 1 is suitably formed to have two straight lines meeting at an angle of from 250 to 358°. In short, it is sufficient if the two straight lines do not run in parallel but run slightly at an angle with each other. If the angle is less than 250°, the apex angle of the mask part in a pseudo triangle shape is too large to bring out the effect of the present invention, whereas if the internal angle exceeds 358°, the good-quality growth film is excessively reduced in the width and the use range is limited.

According to the present invention, the crystal is grown in the transverse direction starting from the fine exposed areas provided on an insulating film, so that the propagation of crystal defects can be intercepted by the insulating film and a substrate with reduced crystal defects can be obtained. In the case of fabricating an electronic device by epitaxially growing a crystal incapable of growing on a substrate without generation of crystal defects, such as GaN system, an epitaxial crystal with reduced crystal defects may be first formed on a single crystal substrate using the above-described transverse growth and then a functional crystal layer may be formed on the resulting substrate using an epitaxial growth process. As a result, an epitaxial growth layer with extremely reduced crystal defects and having a high mobility can be obtained and in turn, a high performance electronic device can be obtained.

EXAMPLES

The present invention is described in greater detail below by referring to the Examples. Unless otherwise indicated, all parts, percents, ratios and the like are by weight.

Example 1

On the (0001) face of sapphire of a size of 20 mm×20 mm, a high temperature GaN epitaxial growth layer was laminated through a low temperature GaN buffer layer working out to a basal layer as follows.

Figure 3:
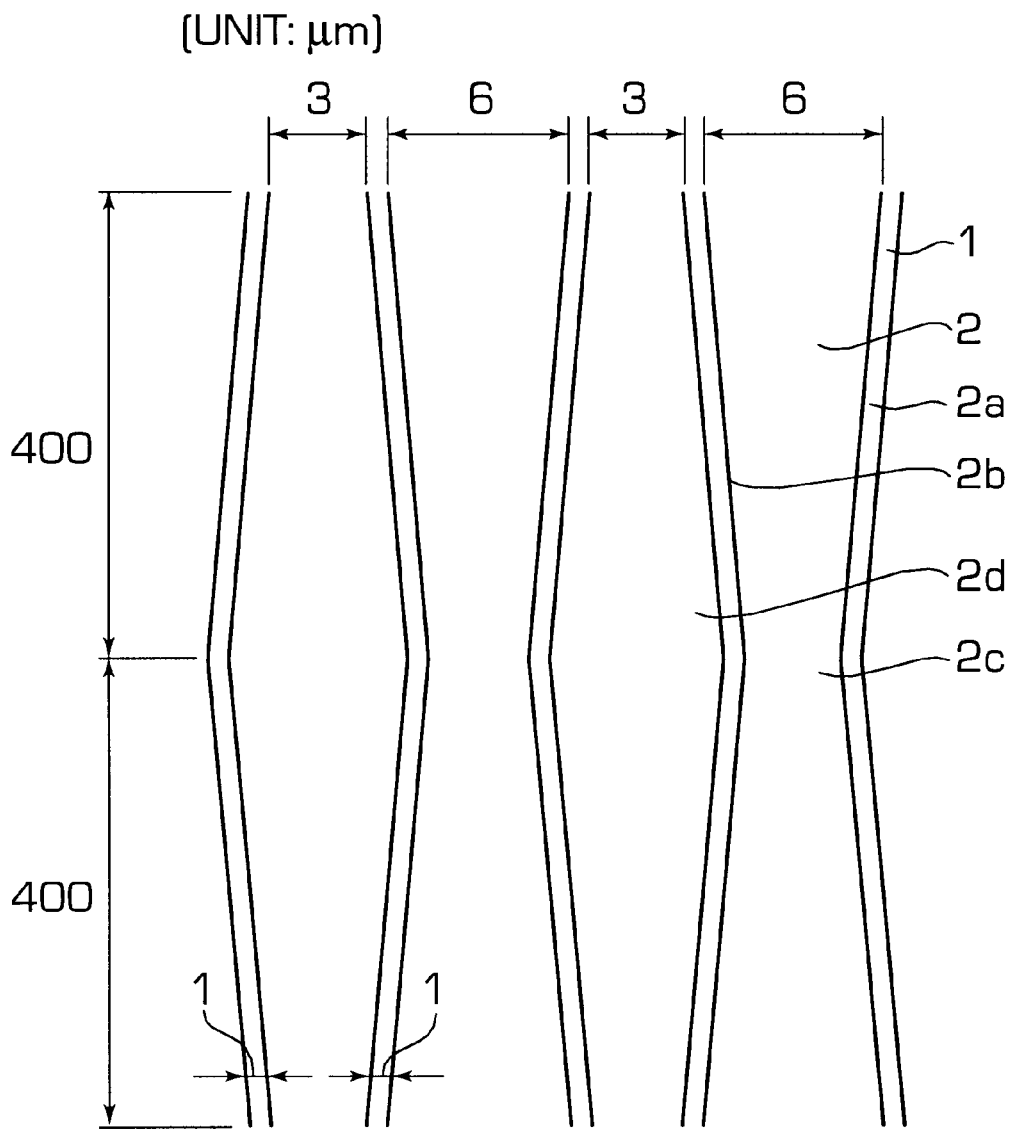
FIG. 3 is a view showing the mask pattern of Example 1.

On the above-described basal layer, a 0.2 $\mu$m-thick $SiO_2$ film was formed by chemical vapor deposition (CVD). A pattern having linear exposed areas 1 and mask parts 2 shown in FIG. 3 was formed in the $SiO_2$ film by conventional photolithography substantially over the entire surface of the substrate. At this time, the narrow portion 2c of the mask part 2 had a width of 3 $\mu$m, the wide portion 2d had a width of 6 $\mu$m, the distance between one bend point and the next bend point was 400 $\mu$m, and the exposed area 1 had a width of 1 $\mu$m.

In this case, the mask boundary angle was about 0.43°.

Thereon, GaN epitaxial growth layers were grown by metal-oxide chemical vapor deposition (MOCVD) to have a thickness of 6 $\mu$m, as a result, the GaN grown layers were joined on the mask part 2.

The cross section of this GaN grown layer was observed through transmission electron microscopy (TEM). Then, it was found that the GaN grown layer on the $SiO_2$ film mask part 2 was greatly reduced in the dislocation density as compared with the layer grown on the exposed area and had a dislocation density of about $1.0\times10^5/cm^2$. On the other hand, the dislocation density of the GaN grown layer on the exposed area 1 with no mask was about $10^8/cm^2$. The junction area 3 on the mask part 2 exclusive of the junction area on the broadest portion of the mask part 2, had substantially the same dislocation density as the grown layer on other portions of the mask part 2. The dislocation density of the junction area on the broadest portion of the mask part 2 was almost the same as that of the GaN grown layer on the exposed area 1.

For the purpose of comparison, a GaN grown layer was formed thoroughly in the same manner as described in Example 1 except that the mask part 2 had a width of 3 $\mu$m all over the length and exposed areas 1 having a width of 1 $\mu$m were formed to run in parallel to each other. The dislocation density of the junction area 3 of the GaN grown layer on the mask part 2 was almost the same as that of the layer on the exposed area 1.

Example 2

On the basal layer formed on the same type of substrate as described in Example 1, the same $SiO_2$ film pattern as described in Example 1 was formed almost over the entire surface. Thereon, a GaN epitaxial growth film was grown by HVPE (hydride vapor phase epitaxial) growth method to have a thickness of 20 $\mu$m, as a result, the grown layers were joined on the mask part 2.

The cross section of this GaN grown layer was observed through TEM. Then, it was found that the GaN epitaxial layer grown on the $SiO_2$ film mask part 2 was greatly reduced in the dislocation density as compared with the GaN layer grown on the exposed area 1 and had a dislocation density of about $1.5\times10^5/cm^2$. On the other hand, the dislocation density of the GaN grown layer on the exposed area 1 with no mask was about $10^8/cm^2$. The junction area 3 on the mask part 2 exclusive of the junction area on the broadest portion of the mask part 2, had substantially the same dislocation density as the GaN grown layer on other portions of the mask part 2. The dislocation density of the junction area on the broadest portion of the mask part 2 was almost the same as that of the grown layer on the exposed area 1.

Example 3

On the basal layer formed on the same type of substrate as described in Example 1, a 0.02 $\mu$m-thick palladium film was formed by sputtering.

The same pattern as described in Example 1 was formed over the entire surface of the 20 mm-square substrate. Thereon, $Al_{0.1}Ga_{0.9}N$ epitaxial growth films were grown by MOCVD to have a thickness of 6 $\mu$m, as a result, the grown layers were joined on the mask part 2.

The cross section of this grown layer was observed through TEM. Then, it was found that the $Al_{0.1}Ga_{0.9}N$ epitaxial growth layer grown on the $SiO_2$ film mask part 2 was greatly reduced in the dislocation density as compared with the layer grown on the exposed area 1 and had a dislocation density of about $7.0\times10^5/cm^2$. On the other hand, the dislocation density of the $Al_{0.1}Ga_{0.9}N$ grown layer on the exposed area 1 with no mask was about $10^8/cm^2$. The junction area 3 on the mask part 2 exclusive of the junction area on the broadest portion of the mask part 2, had substantially the same dislocation density as the AlGaN grown layer on other portions of the mask part 2. The dislocation density of the junction area on the broadest portion of the mask part 2 was almost the same as that of the $Al_{0.1}Ga_{0.9}N$ grown layer on the exposed area 1.

For the purpose of comparison, a $Al_{0.1}Ga_{0.9}N$ grown layer was formed thoroughly in the same manner as described in Example 1 except that the mask part 2 had a width of 3 $\mu$m all over the length and exposed areas 1 having a width of 1 μm were formed to run in parallel to each other. The dislocation density of the junction area on the mask part 2 was almost the same as that of the layer on the exposed area.

Example 4

On the basal layer formed on the same type of substrate as described in Example 1, a 0.2 μm-thick $SiO_2$ film was formed by CVD.

Figure 4:
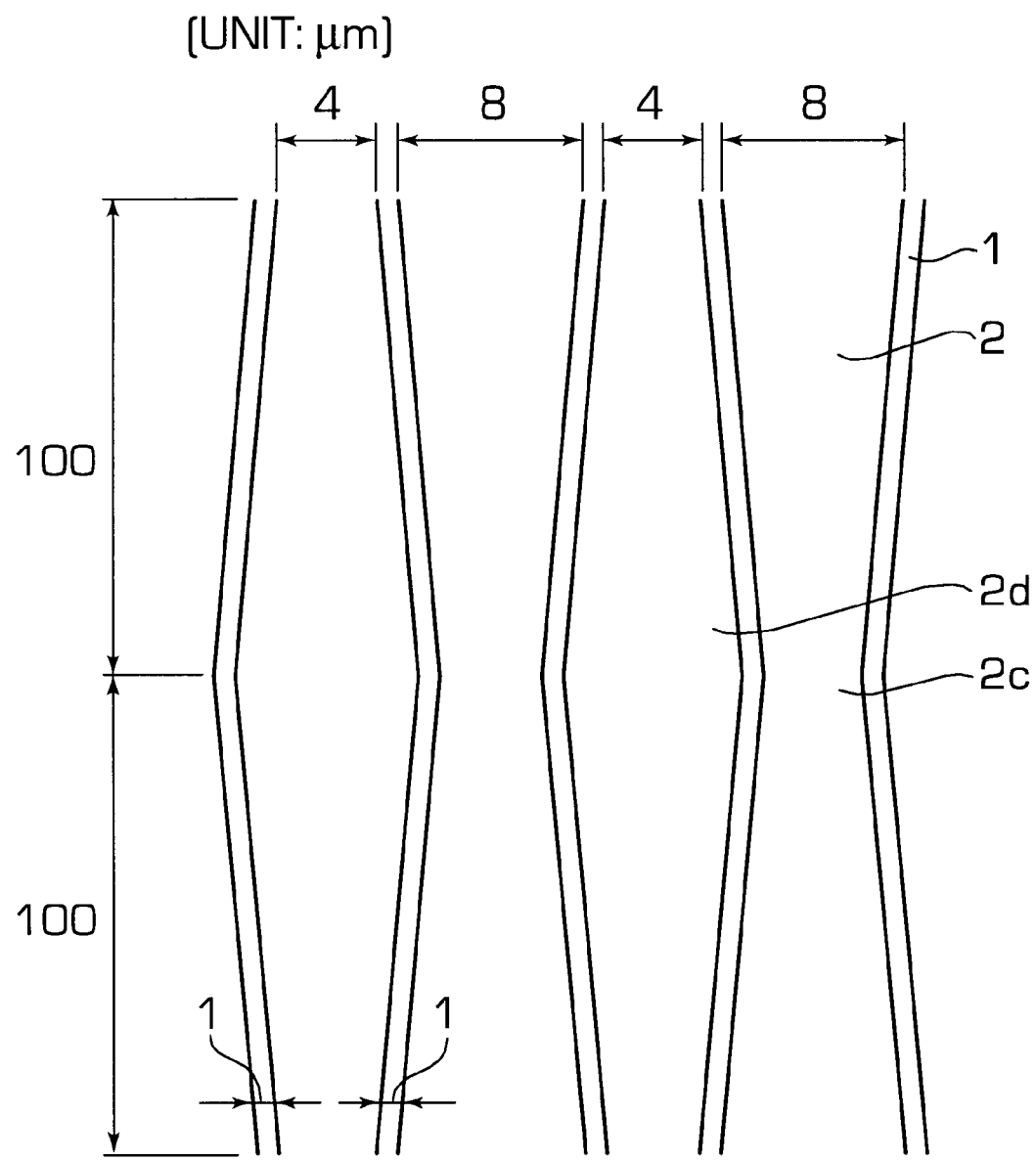
FIG. 4 is a view showing the mask pattern of Example 4.

Then, a pattern having linear exposed areas 1 and mask parts 2 shown in FIG. 4 was formed by conventional photolithography almost over the entire surface of a 20 mm-square substrate. At this time, the narrow portion 2c of the mask part 2 had a width of 4 μm, the wide portion 2d had a width of 8 μm, the distance between one bend point and the next bend point was 100 μm, and the exposed area 1 had a width of 1 μm. In this case, the mask boundary angle was about 2.29°. Thereon, GaN epitaxial growth films were grown by MOCVD to have a thickness of 12 μs, as a result, the GaN grown layers were joined on the mask part 2.

The cross section of this GaN grown layer was observed through TEM. Then, it was found that the GaN epitaxial growth layer on the $SiO_2$ film mask part 2 was greatly reduced in the dislocation density as compared with the GaN layer grown on the exposed area 1 and had a dislocation density of about $1.3 \times 10^5 / cm^2$. On the other hand, the dislocation density of the GaN grown layer on the exposed area 1 with no mask was about $10^8 / cm^2$. The junction area 3 on the mask part 2 exclusive of the junction area on the broadest portion of the mask part 2, had substantially the same dislocation density as the GaN grown layer on other portions of the mask part 2. The dislocation density of the junction area on the broadest portion of the mask part 2 was almost the same as that of the GaN grown layer on the exposed area 1.

Example 5

On the (0001) face of sapphire of a size of 20 mm×20 mm, a 0.2 μm-thick $SiO_2$ film was formed by CVD. A pattern having linear exposed areas 1 and mask parts 2 shown in FIG. 3 was formed in the $SiO_2$ film by conventional photolithography almost over the entire surface of the substrate. At this time, the narrow portion 2c of the mask part 2 had a width of 3 μm, the wide portion 2d had a width of 6 μm, the distance between one bend point and the next bend point was 400 μm, and the exposed area 1 had a width of 1 μm.

In this case, the mask boundary angle was about 0.43°.

Thereon, GaN epitaxial growth layers were grown by MOCVD to have a thickness of 6 μm, as a result, the GaN grown layers were joined on the mask part 2.

The cross section of this GaN grown layer was observed through TEM. Then, it was found that the GaN grown layer on the $SiO_2$ film mask part 2 was greatly reduced in the dislocation density as compared with the layer grown on the exposed area and had a dislocation density of about $1.0 \times 10^8 / cm^2$. On the other hand, the dislocation density of the GaN grown layer on the exposed area 1 with no mask was about $1 \times 10^{10} / cm^2$. The junction area 3 on the mask part 2 exclusive of the junction area on the broadest portion of the mask part 2, had substantially the same dislocation density as the grown layer on other portions of the mask part 2. The dislocation density of the junction area on the broadest portion of the mask part 2 was almost the same as that of the GaN grown layer on the exposed area 1.

For the purpose of comparison, a GaN grown layer was formed thoroughly in the same manner as described in Example 1 except that the mask part 2 had a width of 3 μm all over the length and exposed areas 1 having a width of 1 μm were formed to run in parallel to each other. The dislocation density of the junction area 3 of the GaN grown layer on the mask part 2 was almost the same as that of the layer on the exposed area 1.

Example 6

On the (0001) face of sapphire of a size of 20 mm×20 mm, a high temperature GaN epitaxial growth layer was laminated through a low temperature GaN buffer layer working out to a basal layer as follows.

Figure 5:
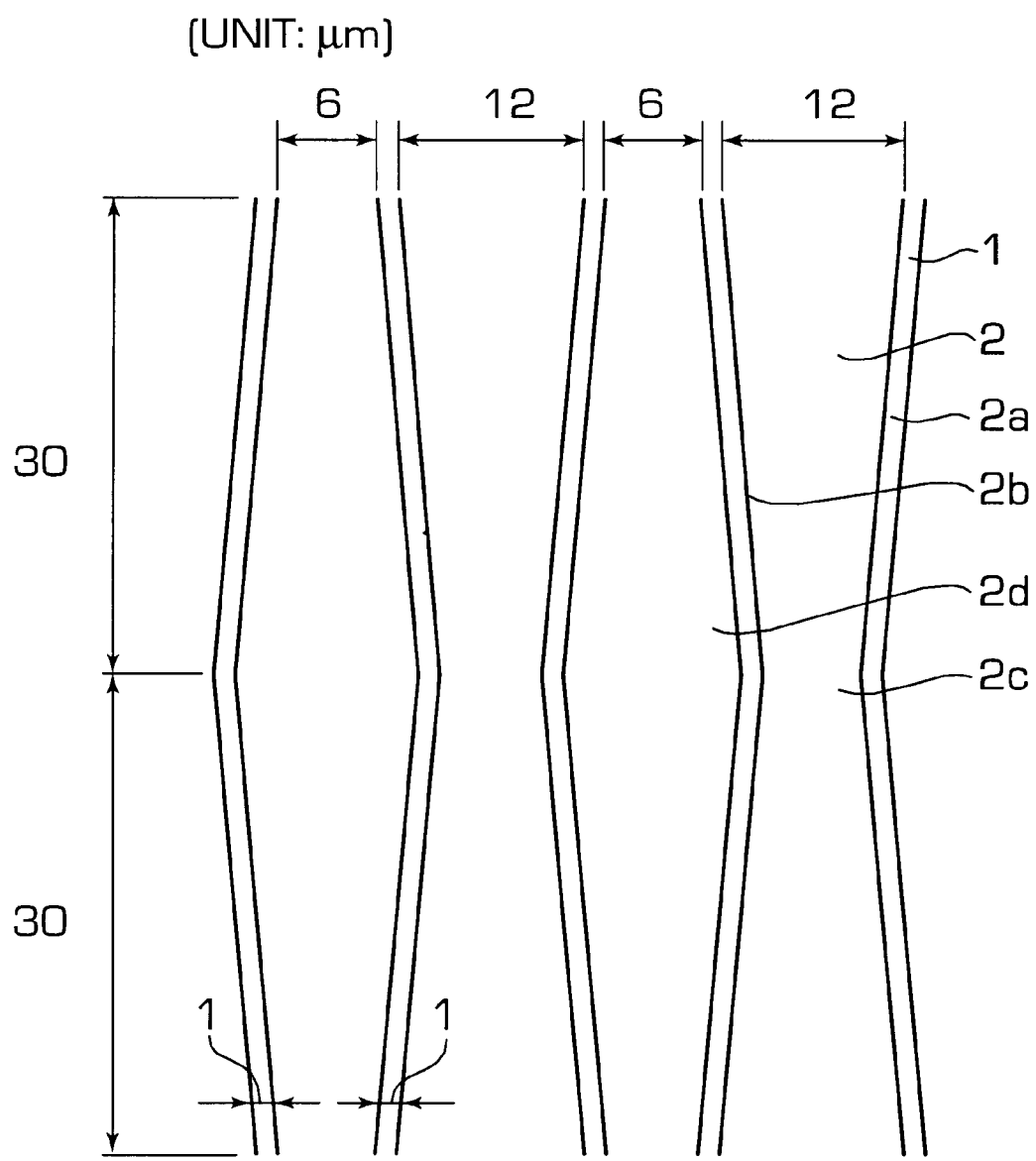
FIG. 5 is a view showing the mask pattern of Example 6.

On the above-described basal layer, a 0.2 μm-thick $SiO_2$ film was formed by CVD. A pattern having linear exposed areas 1 and mask parts 2 shown in FIG. 5 was formed in the $SiO_2$ film by conventional photolithography almost over the entire surface of the substrate. At this time, the narrow portion 2c of the mask part 2 had a width of 6 μm, the wide portion 2d had a width of 12 μm, the distance between one bend point and the next bend point was 30 μm, and the exposed area 1 had a width of 1 μm.

In this case, the mask boundary angle was about 11.3°.

Thereon, GaN epitaxial growth layers were grown by MOCVD to have a thickness of 15 μm, as a result, the GaN grown layers were joined on the mask part 2.

The cross section of this GaN grown layer was observed through TEM. Then, it was found that the GaN grown layer on the $SiO_2$ film mask part 2 was greatly reduced in dislocation density as compared with the layer grown on the exposed area and had a dislocation density of about $1.5 \times 10^5 / cm^2$. On the other hand, the dislocation density of the GaN grown layer on the exposed area 1 with no mask was about $2 \times 10^8 / cm^2$. The growth front 3 on the mask part 2 exclusive of the junction area on the broadest portion of the mask part 2, had substantially the same dislocation density as the grown layer on other portions of the mask part 2. The dislocation density of the junction area on the broadest portion of the mask part 2 was almost the same as that of the GaN grown layer on the exposed area 1.

Example 7

On the 20 mmϕ Si (100) face, a 2 μm-thick GaAs buffer layer working out to a basal layer was laminated by a conventional MBE method.

On the thus-formed basal layer, a 0.2 μm-thick $SiO_2$ film was formed by CVD. In this $SiO_2$ film, a back wedge-shape exposed area 1 shown in FIG. 8 was formed by conventional photolithography almost over the entire surface of the substrate. At this time, the long side A of the exposed area 1 had a length of 140 μm, the short side B meeting the long side A at right angles had a length of 100 μm, the sides C1 and C2 of the back wedge had a length of 120 μm, the side C and the side A were connected through a 5 μm-length side b meeting the side A at right angles, and the internal angle defined by the sides C1 and C2 was about 315°. This back wedge-shape exposed area 1 was formed by conventional photolithography over the entire surface of the substrate.

Thereon, GaAs epitaxial growth layers were grown by a conventional slide board liquid phase epitaxial method using Ga as a solvent to have a thickness of 9 μm, as a result, the GaAs grown layers were joined on the mask part 2.

The EPD (etch pit density) of this GaAs grown layer was examined. The GaAs grown layer on the $SiO_2$ film mask part 2 was greatly reduced in the dislocation density as compared with the layer grown on the exposed area and EPD was not found therein. On the other hand, the dislocation density of the GaAs grown layer on the exposed area 1 with no mask was about $10^5/cm^2$. In the growth front 3 on the mask part 2, EPD was not found similarly to the grown layer on other portions of the mask part 2.

Example 8

On the (0001) face of sapphire of a size of 20 mm×20 mm, a high temperature GaN epitaxial growth layer was laminated through a low temperature GaN buffer layer working out to a basal layer as follows.

On the above-described basal layer, a 0.2 $\mu$m-thick $SiO_2$ film was formed by CVD. In this $SiO_2$ film, a back wedge-shape exposed area 1 shown in FIG. 9 was formed by conventional photolithography almost over the entire surface of the substrate. At this time, the long side A of the exposed area had a length of 40 $\mu$m. the short side B meeting the long side A at right angles had a length of 30 $\mu$m, the sides C of the back wedge had a length of 20 $\mu$m, the side C and the side A were connected through a 2 $\mu$m-length side b meeting the side A at right angles, and the internal angle defined by the sides C1 and C2 was about 308°. This back wedge-shape exposed area 1 was formed by conventional photolithography over the entire surface of the substrate.

Thereon, GaN epitaxial growth layers were grown by MOCVD to have a thickness of 16 $\mu$m, as a result, the GaN grown layers were joined on the mask part 2.

The cross section of this GaN grown layer was observed through TEM. Then, it was found that the GaN grown layer on the $SiO_2$ film mask part 2 was greatly reduced in dislocation density as compared with the layer grown on the exposed area and had a dislocation density of about 1.0× $10^5/cm^2$. On the other hand, the dislocation density of the GaN grown layer on the exposed area 1 with no mask was about $10^8/cm^2$. The growth front 3 on the mask part 2 had substantially the same dislocation density as the grown layer on other portions of the mask part 2. The dislocation density of the junction area on the broadest portion of the mask part 2 was almost the same as that of the GaN grown layer on the exposed area Example 9

On the 20 mm$\phi$ Si (100) face, a 2 $\mu$m-thick GaAs buffer layer working out to a basal layer was laminated by a conventional MBE method.

On the thus-formed basal layer, a 0.2 $\mu$m-thick $SiO_2$ film was formed by CVD. In this $SiO_2$ film, an exposed area 1 consisting of a pair of two congruent right-angled triangles disposed in a line symmetric manner with each other shown in FIG. 10 was formed by conventional photolithography almost over the entire surface of the substrate. At this time, the long sides A1 and A2 of the right-angled triangles had a length of 120 $\mu$m, the short sides B1 and B2 meeting the long sides at right angles had a length of 60 $\mu$m, the hypotenuses C1 and C2 had a length of 134 $\mu$m, and the angle defined by the sides C1 and C2 was about 60°.

Thereon, GaAs epitaxial growth layers were grown by a conventional slide board liquid phase epitaxial method using Ga as a solvent to have a thickness of 9 $\mu$m, as a result, the GaAs grown layers were joined on the mask part 2.

The EPD of this GaAs grown layer was examined. The GaAs grown layer on the $SiO_2$ film mask part 2 was greatly reduced in dislocation density as compared with the layer grown on the exposed area and EPD was not found therein. On the other hand, the dislocation density of the GaAs grown layer on the exposed area 1 with no mask was about $10^5/cm^2$. In the growth front 3 on the mask part 2, EPD was not found similarly to the grown layer on other portions of the mask part 2.

Example 10

On the (0001) face of sapphire of a size of 20 mm×20 mm, a high temperature GaN epitaxial growth layer was laminated through a low temperature GaN buffer layer working out to a basal layer as follows.

On the above-described basal layer, a 0.2 $\mu$m-thick $SiO_2$ film was formed by CVD. In this $SiO_2$ film, an exposed area consisting of a pair of two congruent right-angled triangles disposed in a line symmetric manner with each other shown in FIG. 10 was formed by conventional photolithography almost over the entire surface of the substrate. At this time, the long sides A1 and A2 of the right-angled triangles had a length of 40 $\mu$m, the short sides B1 and B2 meeting the long sides at right angles had a length of 10 $\mu$m, the hypotenuses C1 and C2 had a length of 41 $\mu$m, and the angle defined by the sides C1 and C2 was about 37°.

Thereon, GaN epitaxial growth layers were grown by MOCVD to have a thickness of 16 $\mu$m, as a result, the GaN grown layers were joined on the mask part 2.

The cross section of this GaN grown layer was observed through TEM. Then, it was found that the GaN grown layer on the $SiO_2$ film mask part 2 was greatly reduced in the dislocation density as compared with the layer grown on the exposed area and had a dislocation density of about 1.0× $10^5/cm^2$. On the other hand, the dislocation density of the GaN grown layer on the exposed area 1 with no mask was about $10^8/cm^2$. The growth front 3 on the mask part 2 had substantially the same dislocation density as the grown layer on other portions of the mask part 2.

Comparison Example as to Mask Boundary Angle

The same GaN laminated sapphire substrate as described in Example 1 was used.

Figure 6:
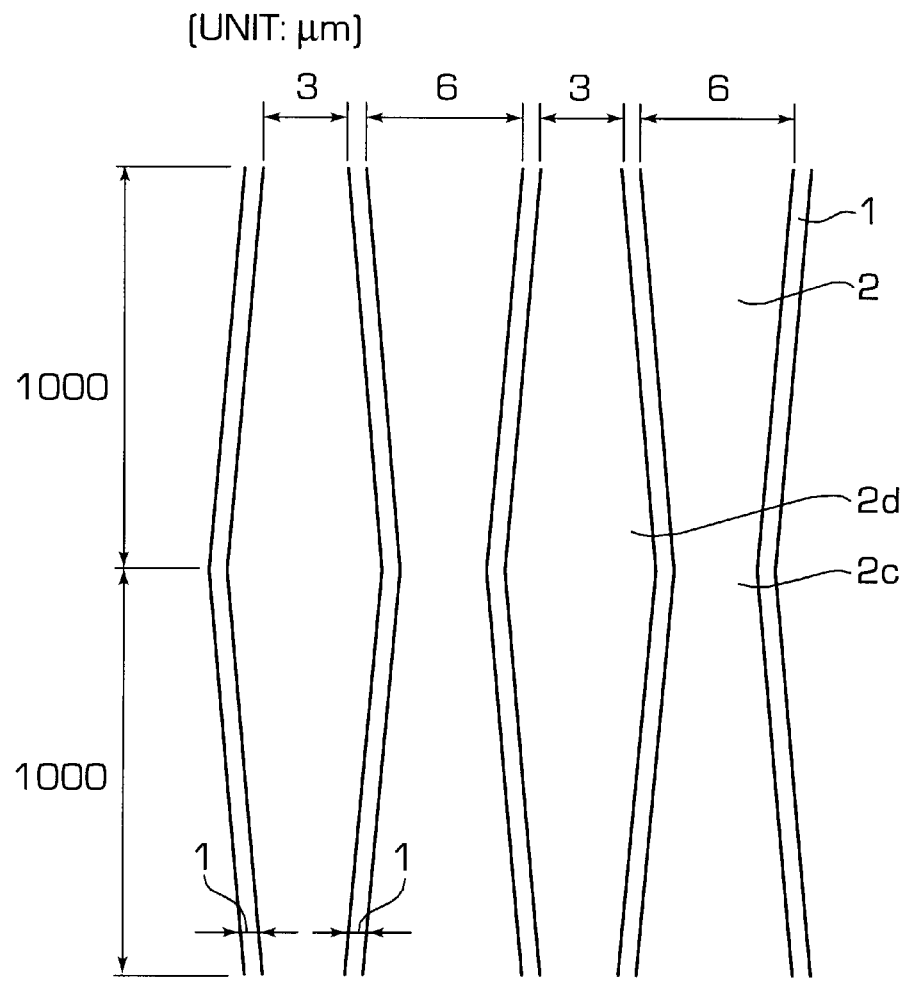
FIG. 6 is a view showing the mask pattern of Comparative Example.

On this substrate, a pattern shown in FIG. 6 was formed by conventional photolithography over the entire surface of the 20 mm-square substrate. In this case, the mask boundary angle was 0.17°. Thereon, GaN epitaxial growth layers were grown by MOCVD to have a thickness of 20 $\mu$m, as a result, the GaN grown layers were joined on the mask part 2.

The cross section of this GaN grown layer was observed through TEM. Then, the GaN epitaxial layer grown on the $SiO_2$ film mask part 2 was greatly reduced in dislocation density as compared with the GaN layer grown on the exposed area 1 and had a dislocation density of about 1.2×$10^5/cm^2$. On the other hand, the GaN grown layer on the exposed area 1 with no mask had a dislocation density of about $10^8/cm^2$. However, the junction area on the mask part 2 had a high dislocation density of the same level as the GaN grown layer on the exposed area 1.

Epitaxial layers were grown in the same manner as above by varying the mask pattern. As a result, it was found that when the mask boundary angle was less than 0.3°, the dislocation density of the junction area on the mask part 2 was partly higher than the dislocation density of portions other than the junction area, revealing that the effect of the present invention is limited.

In the Examples, a $SiO_2$ film was used as the insulating material thin film, however, the insulating material thin film is by no means limited thereto and $Si_2N_4$, TiN and the like can also be used. With respect to the high melting point metal thin film, platinum, titanium, tungsten and the like are also effective in addition to palladium used in the Examples. The mask thickness may be sufficient if the mask can cover the surface of the single crystal substrate and is preferably as small as possible.

The mask pattern formed on the background single crystal is not limited to the shapes described in the Examples and it is needless to say that the object of the present invention can be attained even when curve boundaries are defined by the mask part and two exposed areas 1 adjacent thereto.

In the Examples, the same pattern was formed over the entire surface of the substrate, however, it may also be possible to form a desired pattern on a part of the substrate or to form a pattern matched with the size of the device formed on the substrate and the repeated pitch in the substrate surface. The effectiveness of the present invention is not impaired by these changes.

The background basal layer is not limited to GaN used in the Examples but AlN or AlGaN may be used. Furthermore, the low temperature basal layer composition for the growth of the single crystal may also be AlN or AlGaN.

According to the present invention, a substrate having an extremely low dislocation density can be used for the formation of a functional layer of an electronic device and the functional layer formed on the substrate by epitaxial growth can work out to a good-quality crystal layer remarkably reduced in the crystal defects. An LED or LD using such a good-quality crystal functional layer is favored with high mobility of electrons or holes. By virtue of these properties, a high-performance device can be attained.

While the invention has been described in detail and with reference to specific embodiments thereof, it will be apparent to one skilled in the art that various changes and modifications can be made therein without departing from the spirit and scope thereof.

What is claimed is:

1. A semiconductor substrate comprising a single crystal substrate having thereon a mask and a Group III-V compound semiconductor epitaxially grown layer, said mask comprising an insulating material thin film or high melting point metal thin film having a plurality of slit-like exposed areas running at an angle in excess of 0° with respect to an adjacent slit-like exposed area, and said Group III-V compound semiconductor epitaxially grown layer being formed by growing a Group III-V compound semiconductor starting from each of said plurality of exposed areas and conjunction-integrating the grown semiconductors on said mask.

2. A semiconductor substrate comprising a single crystal substrate having thereon a basal layer, a mask formed on said basal layer and a Group III-V compound semiconductor epitaxially grown layer, said basal layer comprising a Group III-V compound semiconductor grown layer, said mask comprising an insulating material thin film or high melting point metal thin film having a plurality of slit-like exposed areas running at an angle in excess of 0° with respect to an adjacent slit-like exposed area, and said Group III-V compound semiconductor epitaxially grown layer being formed by epitaxially growing a Group III-V compound semiconductor starting from each of said plurality of exposed areas and conjunction-integrating the grown semiconductors on said mask.

3. The semiconductor substrate as claimed in claim 2, wherein said slit-like exposed areas each has a V shape.

4. A semiconductor substrate comprising a single crystal substrate having thereon a mask and a Group III-V compound semiconductor epitaxially grown layer, said mask comprising an insulating material thin film or high melting point metal thin film having a plurality of exposed areas each in the shape of a single closed curve, and said Group III-V compound semiconductor epitaxially grown layer being grown on the mask between said exposed areas starting from said exposed areas adjacent to each other and conjunction-integrated on said mask, wherein two boundaries defined by the mask part between said adjacent exposed areas and respective exposed areas run at an angle in excess of 0°.

5. A semiconductor substrate comprising a single crystal substrate having thereon a basal layer, a mask formed on said basal layer and a Group III-V compound semiconductor epitaxially grown layer, said basal layer comprising a Group III-V compound semiconductor grown layer, said mask comprising an insulating material thin film or high melting point metal having a plurality of exposed areas each in the shape of a single closed curve, and said Group III-V compound epitaxially grown layer being grown on the mask between said exposed areas starting from said exposed areas adjacent to each other and conjunction-integrated on said mask, wherein two boundaries defined by the mask part between adjacent exposed areas and respective exposed areas run at an angle in excess of 0°.

6. A semiconductor substrate comprising a single crystal substrate having thereon a mask and a Group III-V compound semiconductor epitaxially grown layer, said mask comprising an insulating material thin film or high melting point metal thin film having an exposed area in the shape of a single closed straight line having at least one pair of two adjacent linear sides meeting at an angle of from 250 to 358°, and said Group III-V compound semiconductor epitaxially grown layer being conjunction-integrated on the mask part within a triangle including said two sides on said mask.

7. A semiconductor substrate comprising a single crystal substrate having thereon a basal layer, a mask formed on said basal layer and a Group III-V compound semiconductor epitaxially grown layer, said basal layer comprising a Group III-V compound semiconductor grown layer, said mask comprising an insulating material thin film or high melting point metal thin film having an exposed area in the shape of a single closed curve having at least one pair of two adjacent linear sides meeting at an internal angle of 250 to 358°, and said Group III-V compound semiconductor epitaxially grown layer being conjunction-integrated on the mask part within a triangle including said two sides on said mask.

8. A semiconductor substrate comprising a single crystal substrate having thereon a mask and a Group III-V compound semiconductor epitaxially grown layer, said mask comprising an insulating material thin film or high melting point metal thin film having an exposed area consisting of at least one pair of two right-angled triangles disposed in a line symmetric manner with each other such that two sides meeting at right angles of one right-angled triangle lie in a straight line with or run in parallel to two sides meeting at right angles of another right-angled triangle and the internal angle defined by two hypotenuses of said one pair of two right-angled triangles is from 250 to 358°, and said Group III-V compound semiconductor epitaxially grown layer being conjunction-integrated on the mask within a triangle including said two sides on said mask.

9. A semiconductor substrate comprising a single crystal substrate having thereon a basal layer, a mask formed on said basal layer and a Group III-V compound semiconductor epitaxially grown layer, said basal layer comprising a Group III-V compound semiconductor grown layer, said mask comprising an insulating material thin film or high melting point metal thin film having an exposed area consisting of at least one pair of two right-angled triangles disposed in a line symmetric manner with each other such that two sides meeting at right angles of one right-angled triangle lie in a straight line with or run in parallel to two sides meeting at right angles of another right-angled triangle and the internal angle defined by two hypotenuses of said one pair of two right-angled triangles is from 250 to 358°, and said Group III-V compound semiconductor epitaxially grown layer being conjunction-integrated on the mask within a triangle including said two sides on said mask.

10. The semiconductor substrate as claimed in any one of claims 1 to 9, wherein said single crystal substrate is a sapphire substrate.

11. The semiconductor substrate as claimed in any one of claims 1 to 9, wherein said Group III-V compound semiconductor epitaxially grown layer is a Group III nitride crystal.

* * * * *